United States Patent [19]
Brey et al.

[11] Patent Number: 5,594,342
[45] Date of Patent: Jan. 14, 1997

[54] NUCLEAR MAGNETIC RESONANCE PROBE COIL WITH ENHANCED CURRENT-CARRYING CAPABILITY

[75] Inventors: William W. Brey; Richard S. Withers, both of Sunnyvale, Calif.

[73] Assignee: Conductus, Inc., Sunnyvale, Calif.

[21] Appl. No.: 462,663

[22] Filed: Jun. 5, 1995

Related U.S. Application Data

[63] Continuation-in-part of Ser. No. 409,506, Mar. 23, 1995, and Ser. No. 313,624, Sep. 27, 1994, abandoned, which is a continuation-in-part of Ser. No. 891,591, Jun. 1, 1992, Pat. No. 5,351,007.

[51] Int. Cl.$^6$ ................................................. G01V 3/00
[52] U.S. Cl. ......................................... 324/322; 324/318
[58] Field of Search ............................ 324/318, 321, 324/322; 29/829, 846, 847; 505/192, 202, 220, 329, 844

[56] References Cited

U.S. PATENT DOCUMENTS

| | | | |
|---|---|---|---|
| 2,657,310 | 10/1953 | Runft | 250/33 |
| 3,764,938 | 10/1973 | Barnes | 331/96 |
| 4,346,537 | 8/1982 | Masujima et al. | 51/413 |
| 4,409,608 | 10/1983 | Yoder | 357/51 |
| 4,636,730 | 1/1987 | Bottomly | 324/318 |
| 4,769,883 | 9/1988 | Misic et al. | 128/653.5 |
| 4,792,790 | 12/1988 | Reeb | 29/846 |
| 4,872,068 | 10/1989 | Huang et al. | 361/321 |
| 4,894,316 | 1/1990 | Hjulstrom | 430/316 |
| 4,894,629 | 1/1990 | Okamura et al. | 333/177 |
| 4,981,838 | 1/1991 | Whitehead | 505/1 |
| 5,061,686 | 10/1991 | Ruby | 565/1 |
| 5,075,281 | 12/1991 | Testardi | 505/1 |
| 5,172,461 | 12/1992 | Pichl | 29/25.42 |
| 5,219,827 | 6/1993 | Higaki et al. | 505/1 |
| 5,231,078 | 7/1993 | Riebman et al. | 505/192 |
| 5,247,256 | 9/1993 | Marek | 324/321 |
| 5,258,710 | 11/1993 | Black et al. | 324/309 |
| 5,276,398 | 1/1994 | Withers et al. | 324/318 |
| 5,351,007 | 9/1994 | Withers et al. | 324/322 |

FOREIGN PATENT DOCUMENTS

WO94/05022  3/1994  WIPO.

OTHER PUBLICATIONS

Gupta, et al., *Computer-Aided Design of Microwave Circuits*, ARTECH House, Inc. 217–220 (1981).

Banson, et al., "A probe for specimen magnetic resonance microscopy" (Feb. 1992). *Investigative Radiology* 27:157–164.

Black, et al., "A high-temperature superconducting receiver for nuclear magnetic resonance microscopy" (Feb. 5 1993) *Science* 259:793–795.

*Primary Examiner*—Louis M. Arana
*Attorney, Agent, or Firm*—Judith A. DeFranco

[57] ABSTRACT

The conductive material in an RF coil disposed in the polarizing field of an NMR apparatus in miminized and the current density at each point in the coil kept constant by providing an inductive element and a set of tapered, interidgtated capacitors having a uniform gap therebetween. The invention maximizes the current-carrying capacity of the coil.

18 Claims, 13 Drawing Sheets

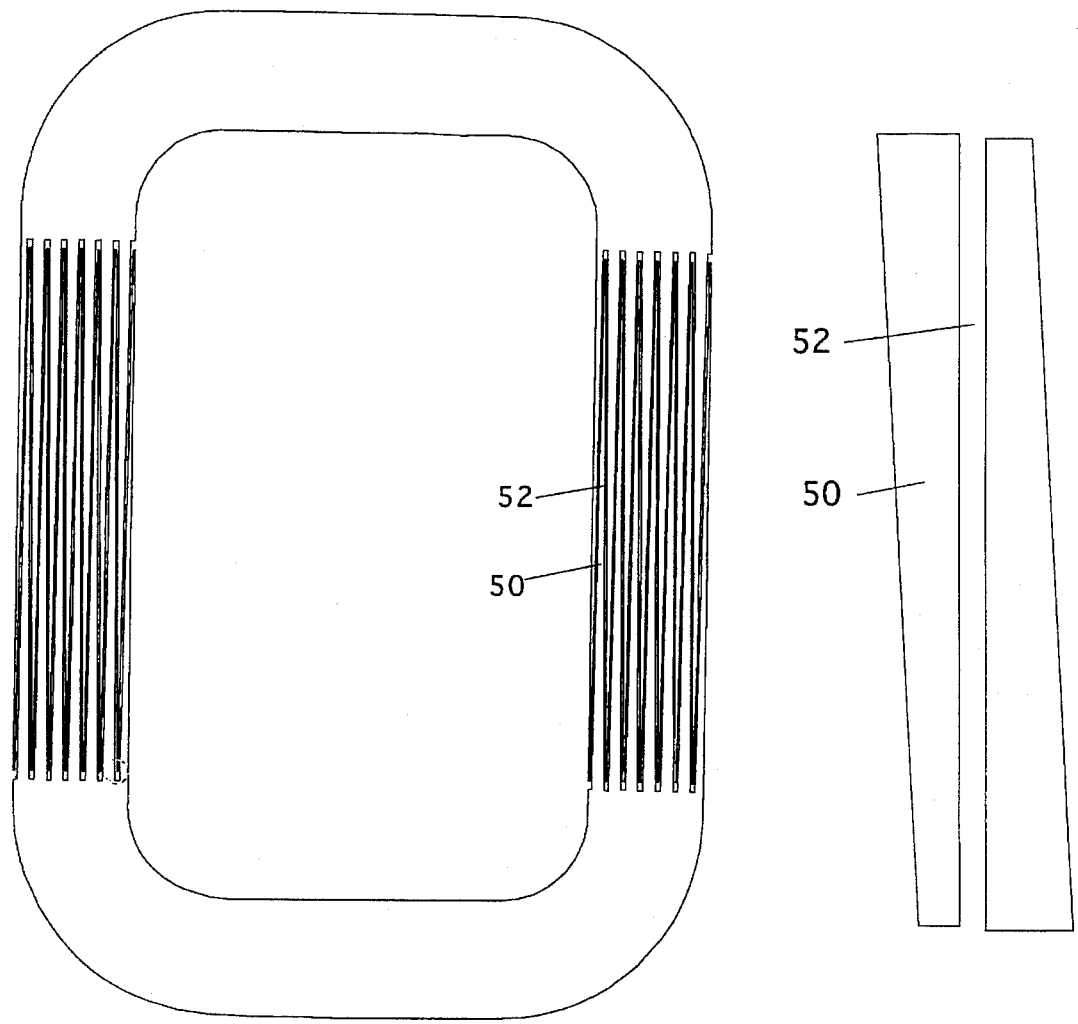
Figure 6c
Figure 6a
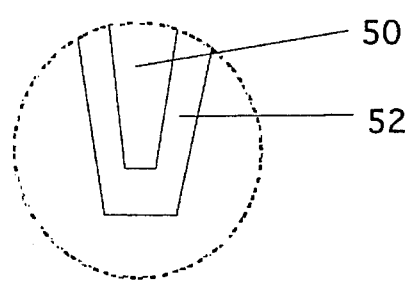
Figure 6b

NUCLEAR MAGNETIC RESONANCE PROBE COIL WITH ENHANCED CURRENT-CARRYING CAPABILITY

STATEMENT OF GOVERNMENT INTEREST

The U.S. Government has a paid-up license in this invention and the right in limited circumstances to require the patent owner to license others on reasonable terms as provided for by the terms of Grant No. 2B44RR09751 awarded by the National Institutes of Health.

CROSS-REFERENCE TO RELATED APPLICATIONS

This application is a continuation-in-part of U.S. patent application Ser. No. 08/409,506 by Richard S. Withers filed Mar. 23, 1995, and a continuation-in-part of U.S. patent application Ser. No. 08/313,624 by Richard S. Withers, Guo-Chun Liang and Marie Johansson filed Sep. 27, 1994 now abandoned, which is a continuation-in-part of Ser. No. 891,591, now U.S. Pat. No. 5,351,007 by Richard S. Withers and Guo-Chun Liang filed Jun. 1, 1992, each of which is incorporated herein by reference.

BACKGROUND OF THE INVENTION

1. Field of the Invention

This invention relates to RF probes for Nuclear Magnetic Resonance spectroscopy and microscopy. More particularly, it relates to resonant coils for the transmission and reception of NMR signals. Even more particularly, it relates to superconductor coils on planar substrates.

2. Description of Related Art

In an NMR spectrometer probe, a sample is placed in a static magnetic field which causes atomic nuclei within the sample to align in the direction of the field. Transmit and receive coils, which may be combined in a single coil or set of coils, are placed in the probe positioned close to the sample. The transmit coils apply an RF magnetic field orthogonal to the direction of the static magnetic field, perturbing the alignment of the nuclei. The transmit signal is then turned off, and the resonant RF signal of the sample is detected by the receiver coil.

The sensitivity of the spectrometer depends on a number of factors, including the strength of the static field, the closeness of the coupling between the RF coils and the sample, and the resistance of the RF coil. Currently, all commercial NMR spectrometers use RF coils made of a normal metal, such as copper, or a combination of normal metals. Much research has been coils have been made in the form of solenoids, saddle coils and birdcage coils, all of which have high filling factors. Similarly, researchers have suggested cooling of RF coils to reduce their resistance. However, the sensitivity of conventional normal-metal coils is limited by their resistance to a value less than that achievable with superconducting coils, even at low temperatures.

The use of superconductors in place of conventional normal metal for RF coils in NMR spectrometers has previously been suggested. For example, Marek, U.S. Pat. No. 5,247,256, describes several RF receiver coil arrangements for NMR spectrometers using thin-film NbTi superconducting coils. Marek's embodiments differ from the present invention in several respects. In particular, Marek's coils are nonplanar and use ohmic contacts, both of which are easily realizable with NbTi.

The advantage to be obtained with high temperatrue superconductor ("HTS") coils is significant. HTS coils would have very low resistance and be operable in high magnetic fields at temperatures achievable with currently available refrigeration systems (above 20 K). The quality factor, Q, of the coil is a useful measure of the coil's efficiency. $Q=\omega L/r$, where $\omega$ is the resonant frequency, L is the inductance and r is the resistance of the coil. Well-designed room temperature NMR coils achieve loaded Qs of about 250. Because of the extremely low resistance of HTS coils, coils with loaded Qs of 10,000 or more are possible. However, this advantage can only be realized if the other factors necessary for a superior NMR probe, reasonable filling factor and high RF and DC field homogeneity, are met. Thus, the ideal RF probe for NMR would have a transmit/receive coil which would resonate at the desired operating frequency, produce a homogeneous RF field, not significantly disturb the DC field, have a high filling factor, have a high Q, small parasitic losses and produce a high RF magnetic field over the volume of the sample.

In addition to Marek, others have reported thin-film superconductor RF coils for magnetic resonance applications. For example, Withers, U.S. Pat. No. 5,276,398 describes a thin-film HTS probe for magnetic resonance imaging. It discloses a thin-film coil having inductors in a spiral of greater than one turn and capacitive elements extending from the inductors. Withers thus provides a thin film distributed capacitance probe coil. However, it does not address minimizing magnetic field disturbances by the coil, nor does it address maximizing the current carrying capacity of the coil.

Withers, et al., U.S. Ser. No. 08/313,624, which is incorporated herein by reference, presents one type coil design suitable for NMR spectroscopy. It consists of a single loop with a single interdigital capacitor along one edge. Although its RF performance is adequate, it has several deficiencies which the present invention corrects. Similarly, Black, U.S. Pat. No. 5,258,710, describes HTS thin-film receiver coils for NMR microscopy. Black discloses several embodiments, including split ring, solenoidal, saddle coils, birdcage coils and coils described as "Helmholtz pairs." Black's embodiments are essentially conventional NMR coil designs and do not address the unique characteristics of high-temperature superconductor materials.

Superconductors are very attractive for use in these coils: They have very low resistance at radio frequencies and, hence, produce little noise. Even so, to obtain high signal-to-noise ratio (SNR), the coils must be as close as possible to the sample. Unfortunately, this means that any magnetization of the coil material will affect the uniformity of the DC polarizing field ($B_0$) over the sample volume, producing a distortion of the spectral line shape and degradation of SNR. Because superconductors are strongly diamagnetic line-shape distortions could be severe.

High temperature superconductors (HTS) are especially attractive for use in NMR coils because they may be operated at temperatures of 20 to 80 K, permitting use of refrigeration units, rather than requiring the use of liquid helium for cooling. However, thin-film HTS films have additional limitations.

Thin-film HTS coils offer design and processing challenges not present with normal-metal coils. First, high-temperature superconductors are perovskite ceramics which require a well-oriented crystal structure for optimum performance. Such orientation is extremely difficult to achieve on a nonplanar substrate. Generally, such coils are preferably deposited epitaxially on a planar substrate. This makes the achievement of a high filling factor more challenging. It is also desirable for the coil to be deposited in a single layer of superconducting film, without crossovers. Second, the coil must be able to handle relatively high currents while producing a uniform magnetic field and avoiding distortion of the $B_0$ field of the magnet. Even when HTS films are deposited epitaxially on a planar substrate, crystalline defects inevitably occur. This can lead to burn out of fine features of a coil exposed to high currents. Third, it is well known in the art that forming ohmic contacts between an HTS and a normal metal is difficult and generally leads to parasitic losses at the point of contact. To the extent a normal metal is used in the coil, resistive losses in the metal elements would lessen the advantages gained from the use of the HTS. Thus, an ideal probe should avoid normal-metal conductors. We are unaware of any prior art which takes into consideration the unique requirements for a superconducting NMR spectroscopy probe coil made from a high temperature superconductor.

SUMMARY OF THE INVENTION

An object of the invention is to provide a thin-film oxide superconductor NMR probe coil. It is a further object of the invention to reduce the effect of the HTS coil on the uniformity of the polarizing field throughout the sample volume. It is yet another object of the invention to provide an NMR coil with increased RF current-carrying capability of the coils. Another object of the invention is to provide an NMR coil with reduced electric fields from the coil which fringe into the sample volume and hence less noise. A further object of the invention is to provide an NMR coil resistant to frequency shifts due to conductor burn out at operating currents.

These and other objects of the invention are met by providing an RF coil made from a thin film of conductive material forming a plurality of nested loops. Each of the loops is interrupted by a nonconductive area defining a gap. Adjacent loops are nested so that the gap of any one loop is not proximately disposed to the gap of an adjacent loop. The coil is of an essentially uniform width throughout. In a preferred embodiment, the gaps are symmetrically positioned to afford capacitive elements with essentially equal capacitance. The segments of the loops defined by the gaps form fingers, with a finger being defined by a segment of the loop disposed between adjacent gaps (that is, ½ of a loop segment). The loops form an inductive element and adjacent fingers form a capacitive element. Preferably, the coil is formed from a thin-film of a high temperature superconductor on a planar substrate, the coil being nearly symmetrical in both y and z, where z is the direction of the polarizing field $B_0$ and y is the plane of the coil perpendicular to z. Preferably, the coil includes a plurality of capacitors in series.

In another embodiment of the invention, the fingers forming the capacitors are each divided into fingerlets to reduce magnetization. The fingerlets provide an advantage in any application in which an LC resonant structure is used and magnetization must be reduced. In yet another embodiment, the capacitors are tapered in the direction of the current to maintain a nearly constant current density throughout the coil.

For NMR spectroscopy, these coils must both transmit and receive signals of the appropriate frequency, typically in the range of 10 to 1000 MHz at currents of 10 amperes or more in the coil. This requires very high current densities, as high as $10^6$ amperes per $cm^2$ or more, in the HTS thin film. Under such circumstances, we have frequently observed a sudden and irreversible shift upward in the resonant frequency of the coil, which typically makes the coil unusable. It is thought that the frequency shifts because some small region of one of the capacitive fingers of the coil became resistive, resulting in a discharge of the stored energy of the coil and the destruction of the conductive properties of that small region. The capacitance of the severed finger is removed from the circuit, so its resonant frequency rises.

We have devised a method to stress, or "burn in," the coils prior to a final trimming process, so that those fingers which are likely to fail will do so prior to final trimming. An essential first step is that the coil design provide more capacitance than is needed, enough so that if all defective fingers are removed, the coil resonant frequency is still below the desired frequency of operation. Following burn-in, the coil is trimmed to the desired resonant frequency.

BRIEF DESCRIPTION OF THE DRAWINGS

Refering to the drawings in which like reference numbers refer to like parts:

FIG. 1b depicts the equivalent circuit of the coil of FIG. 1a;

FIG. 2b depicts the equivalent circuit of the coil of FIG. 2a;

FIGS. 6a, 6b and 6c depict an embodiment of the invention having tapered conductors;

DESCRIPTION OF PREFERRED EMBODIMENTS

Figure 1A:
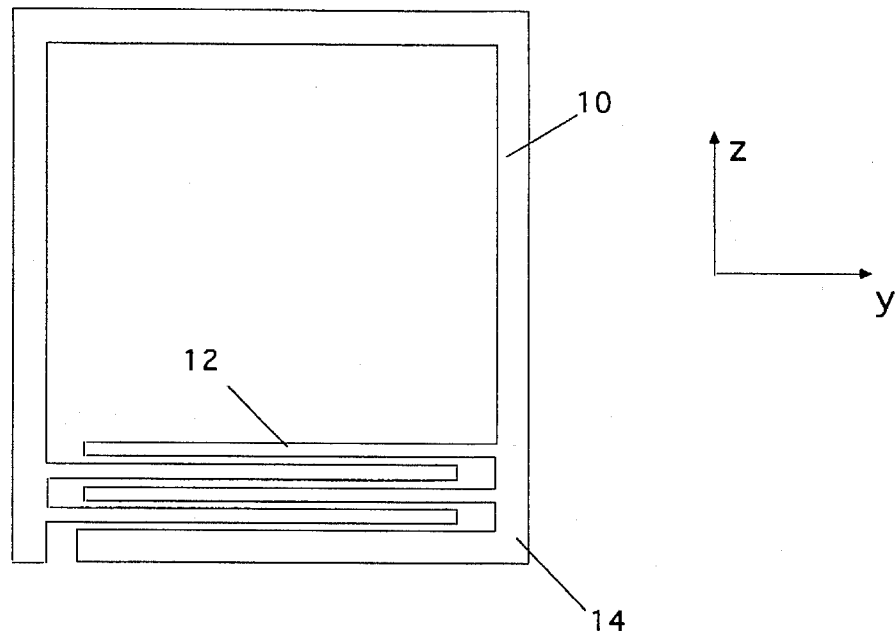
FIG. 1a depicts a coil according to U.S. Ser. No. 08/313,624.
Figures 1B, 2B:
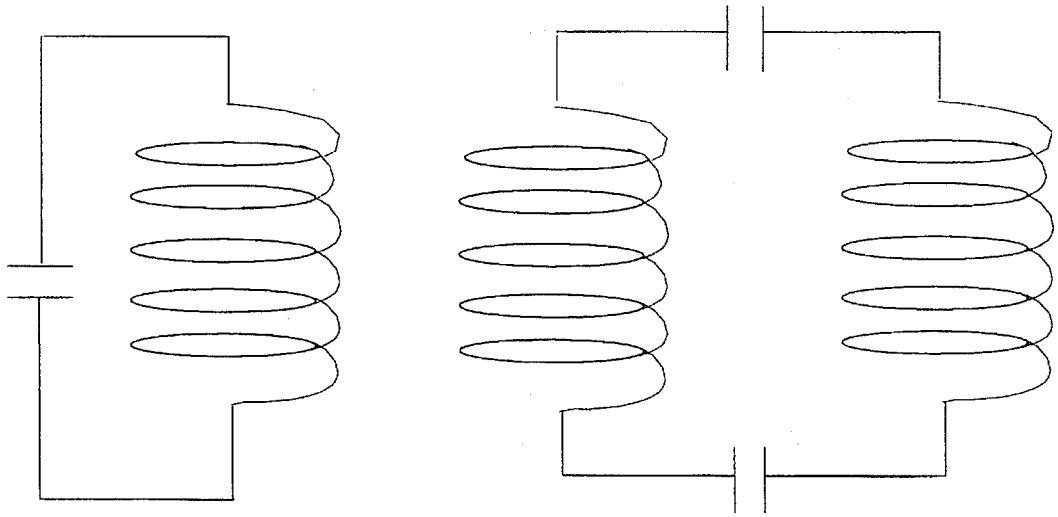

FIG. 1a. depicts an NMR coil according to Withers et al. It consists of a single loop 10 inductor of greater than one turn with a single interdigital capacitor 12 along one edge. The loop has a length and a width, with squared corners 14. Other embodiments of Withers have a continuous spiral structure or a spiral with crossovers. FIG. 1b depicts the equivalent circuit of the coil of FIG. 1a. Although the RF performance of the coil of FIG. 1a is adequate for some applications, tiffs design has several limitations which the present invention seeks to avoid. First, it is asymmetric in the z direction, and to a lesser extent, in the y direction. It is preferable to avoid asymmetries in both y and z, as they result in greater magnetic inhomogeneities over the sample volume centered within the coil. Second, it has a single capacitor; consequently, the voltage $\omega LI$ developed along the loop inductance is present as a single electric dipole across nearly the full coil width, with an electric field reaching into the sample volume. In an ideal coil a magnetic field, but no electric field other than that induced by the time-varying magnetic field, is coupled to the sample volume. Third, current crowding occurs near the corners, limiting the current carrying capacity of the coil as a whole. Fourth and most importantly, because the superconductor is in the form of a single line except in the capacitor in response to the polarizing magnetic field, DC shielding currents flow in relatively large loops, which introduces large inhomogeneities in the polarizing field in the sample volume. The current invention provides an advantage over the coil of FIG. 1 by providing structures that minimize magnetic disturbances while improving other properties.

Figure 2A:
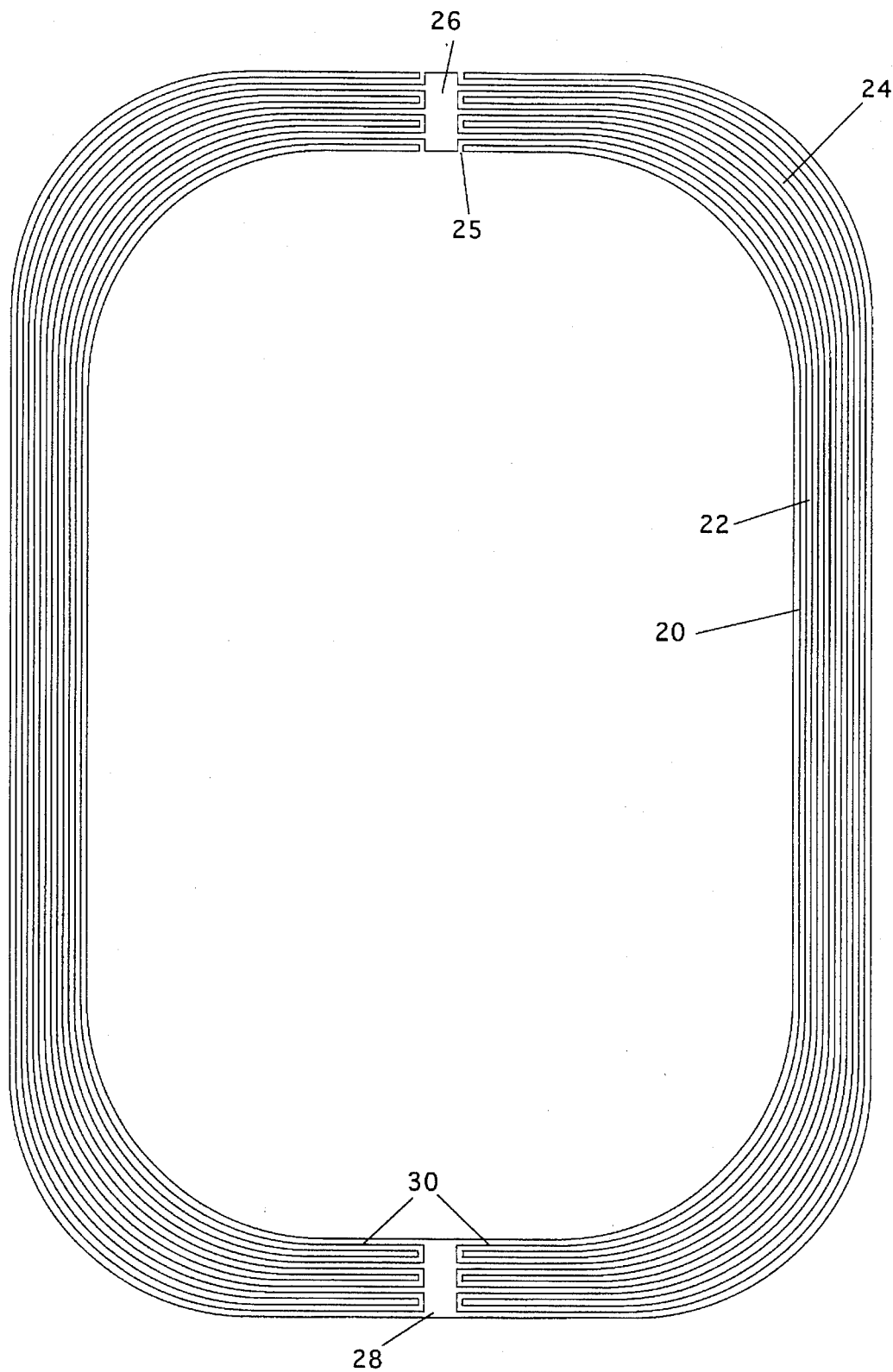
FIG. 2a depicts a two-capacitor embodiment of the invention.
Figure 2C:
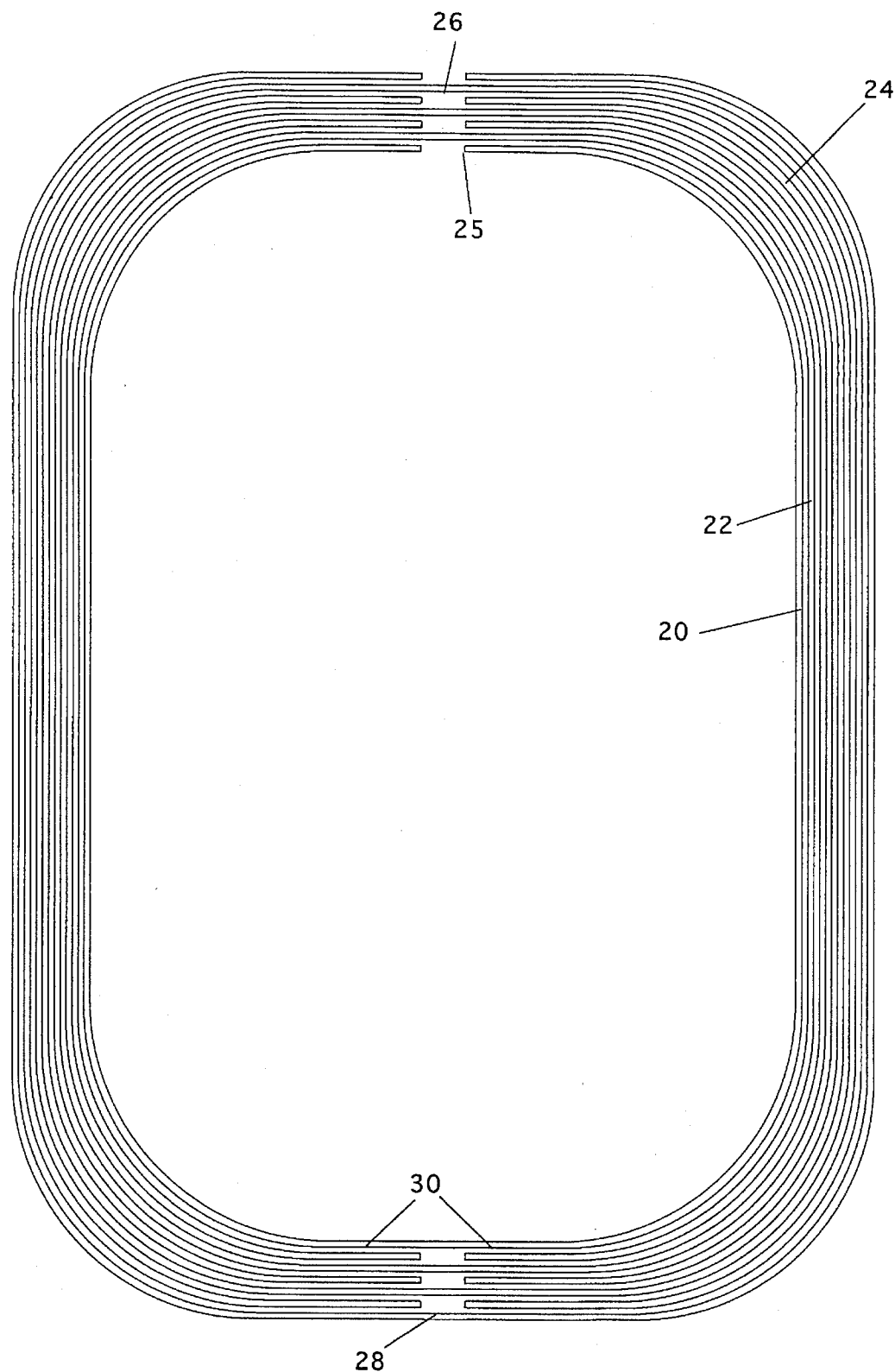
FIG. 2c depicts a variation of the coil of FIG. 2a, without interconnects.

FIG. 2a depicts a first coil of the invention having greater symmetry than the coil of FIG. 1a, achieved by the use of two capacitors in series. FIG. 2a is not drawn to scale but, rather, is drawn so as to better illustrate the features of the invention. A superconducting film forms two sets of elongated, interdigitated conductors 20, 22, forming loops of slightly less than one turn each with a gap 25 between terminals of the conductors. A set of conductors consists of one or more conductors having their gaps aligned along a common radian of the coil. The gaps of the two sets of coils are symmetrically positioned with respect to the coil's axis. Each loop is rounded at the corners 24 to avoid current crowding. The coil is of an essentially uniform width. Adjacent conductors between consecutive gaps around the perimeter of the coil form a capacitor. As used herein, a section of conductor between two gaps is a "finger." It may readily be seen that for a two-capacitor coil, a loop consists of two fingers 30. Each loop of the coil has a slightly different perimeter from that of adjacent loops to accommodate a nested structure. The RF current flows around the loops. In FIG. 2a, each set of loops is joined at a node 26, 28. As shown in FIG. 2c and discussed below, the nodes are not necessary for a functional coil but their inclusion may improve coil yield. As shown in the equivalent circuit, FIG. 2b, the interdigitated conductors form two capacitors in series. While the coils of FIGS. 2a and 2c do not achieve perfect mirror symmetry about two planes, (that would require four symmetrically-placed capacitors) they are significantly more symmetrical than the coil of FIG. 1a.

For an NMR spectroscopy coil, the overall dimensions of the coil are chosen to maximize the filling factor for the sample volume. Suitable inside dimensions for a coil for use with a 5 mm sample tube are 1.7 cm×1.2 cm. The number of fingers is then selected with reference to the principles discussed below and to achieve the desired resonant frequency for the probe assembly. In one embodiment having two capacitors, seven loops were used, giving six gaps with 50 μm gaps between loops.

The principles disclosed in the coil of FIG. 2a may be extended to coils having N symmetrically positioned capacitors in series. In that case, each finger occupies 1/N of the perimeter of the coil, and each interdigitated conductor consists of one side of two adjacent capacitors with a total length of slightly less than 2/N of the perimeter of the coil. Conductors must be paired to complete loops with gaps separating the capacitive segments. Thus each loop extends over all N capacitors of the coil.

Figure 3:
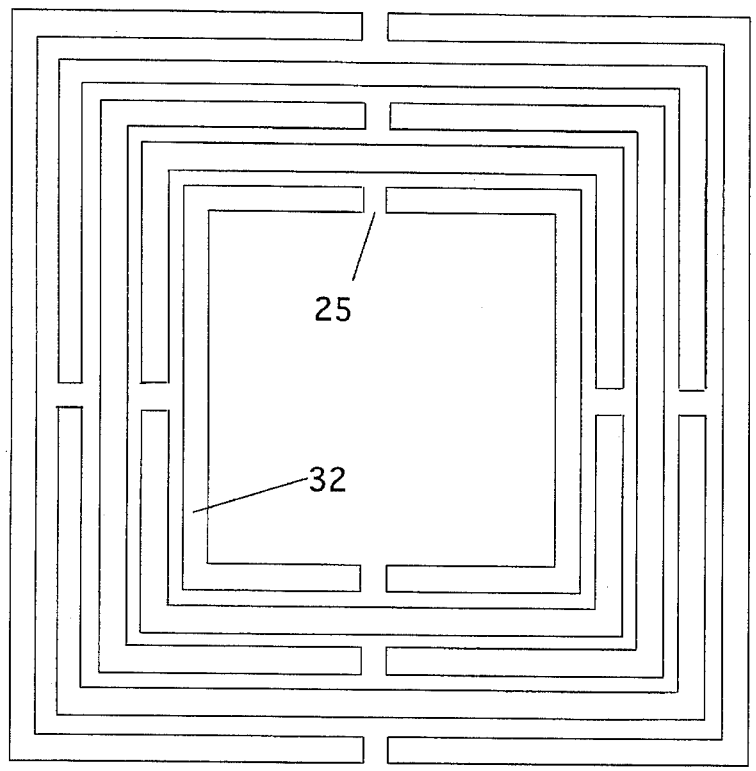
FIG. 3 depicts a four-capacitor embodiment of the invention.
Figure 4:
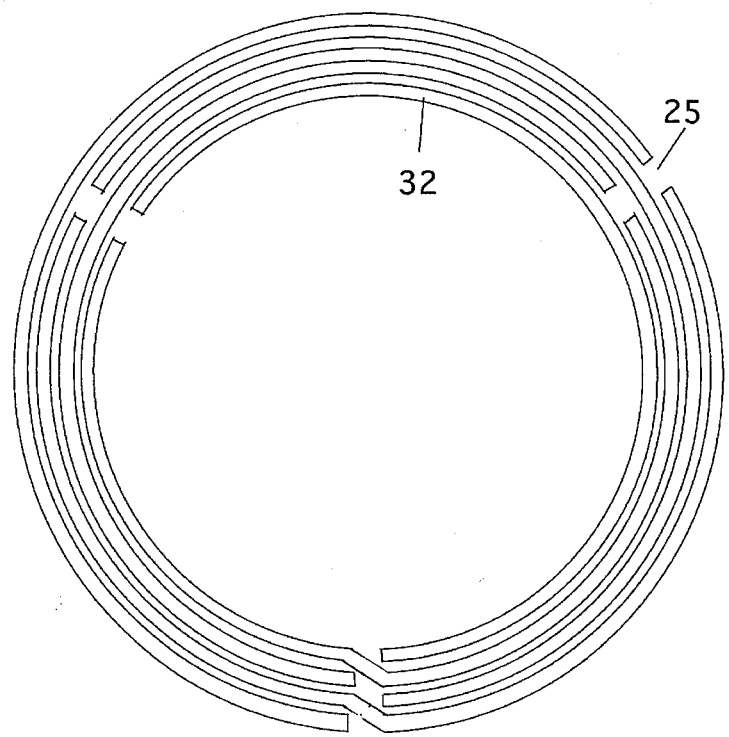
FIG. 4 depicts a three-capacitor embodiment of the invention.

FIG. 3 depicts a coil having four capacitors symmetrically placed. Four sets of conductors 32 are symmetrically placed around the coil. Each conductor has a length of ½ the perimeter of the coil minus the length of the gaps 25 between loops. Unlike the coil shown in FIG. 2a, in which all fingers of a given side of each capacitor are shorted electrically at "tie points" or connecting nodes at the top and bottom of the coil, no such nodes are present in the coil of FIG. 3. No voltage should be developed between the several fingers on one electrical side of a capacitor, and thus these tie points may be eliminated without significantly affecting low-current performance: FIG. 4 depicts a coil having three sets of conductors 32 with three sets of gaps 25 placed symmetrically around the coil forming three capacitors. It may readily be seen that coils may be designed with any desired number of capacitors.

Use of two or more capacitors in series within the loop affects other elements of the design. Because the effective capacitance of N capacitors of capacitance C in series is C/N, the gross capacitance required is $N^2$ times that required of a single-capacitor design. In order to achieve this level of capacitance in an interdigital design, finer lines are required. This has a corollary benefit in reducing the width of shielding-current loops and hence magnetic disturbances, but is limited by the ability of the film deposition and photolithography processes to make defect-free coils with fine lines. To achieve the required capacitance, the length of the capacitors is extended as much as possible. Considerations related to selection of the length, width, inductance and capacitance of a coil are further discussed in Withers, U.S. Ser. No. 08/409,506.

Figure 5:
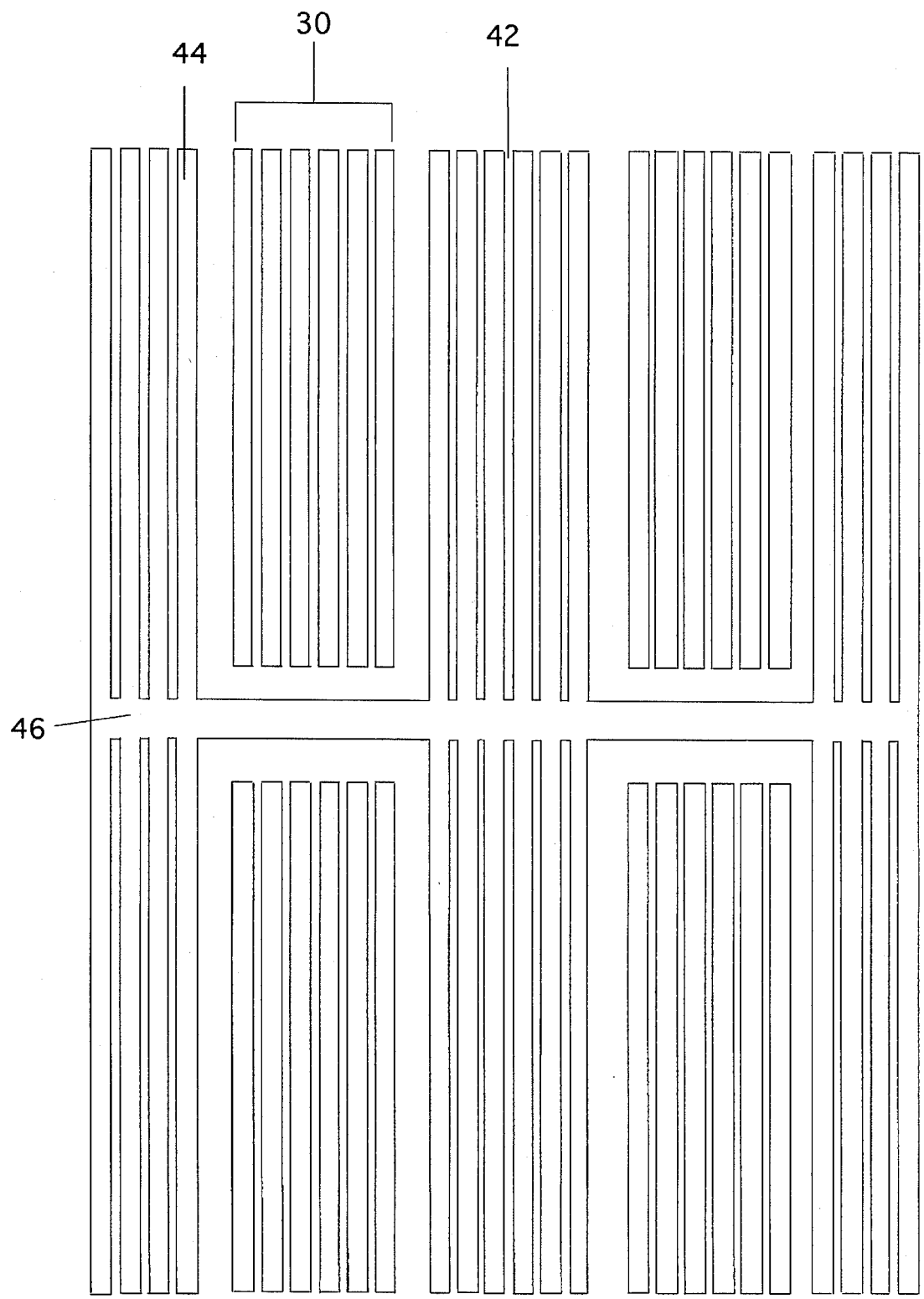
FIG. 5 depicts an embodiment of the invention having fingerlets.

In some cases, sufficiently small shielding currents are not obtained with single-line fingers of the width required for the desired capacitance. To further reduce the shielding currents, the individual lines of the capacitor fingers may be slit in the direction parallel to that of the RF current flow so that a number "m" of "fingerlets" are created. This will not affect the RF performance (except for small effects in proportion to the amount of material removed), but reduces magnetization effects by a factor of approximately m. FIG. 5 shows part of a design in which each finger 30 of the interdigital capacitors has been slit into 4 or 6 fingerlets 44. The gaps between the fingerlets 42 can be minimal (e.g., 10 μm), as little voltage is developed between the fingerlets, and a short circuit resulting from a photolithographic defect will degrade $B_0$ uniformity only in proportion to the critical current of the bridging defect. The fingerlets may optionally be joined by a common node 46.

Figure 6D:
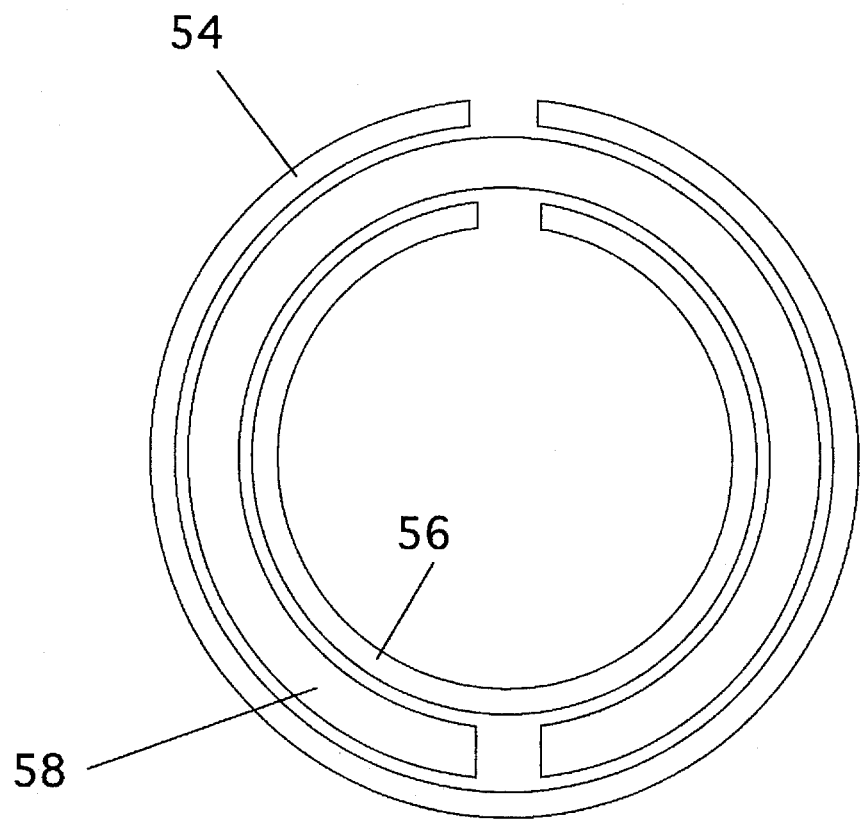
FIG. 6d depicts an embodiment of the invention in which the width of the lines are sized to increase current-carrying capacity.

FIG. 6a depicts a coil in which the interdigital conductors 50 are tapered along their length. The gap, or separation between conductors 52 is kept constant over its entire length. FIG. 6b shows an enlarged tip of a single conductor. The tapered conductor 50 is truncated at its tip. FIG. 6c shows an enlarged view of a pair of adjacent tapered conductors 50 with the uniform space 52 between conductors. Tapering the electrodes makes optimal use of the current-carrying ability of the superconducting film. Because the current carried by each finger decreases linearly toward its end as current is transferred to the fingers on the other (electrical) side of the capacitor, this approach maintains constant current per unit of film width. By placing the conductor where it is most needed, tapering also reduces the RF resistance of the coil. and hence its contribution to system noise. Similarly, as shown in FIG. 6d, the outermost 54 and innermost 56 lines of the capacitors carry only half of the current of the interior 58 capacitors, and need only be one-half the width of the other fingers. Similarly, because of their shorter length, the conductors nearer the center of the coil carry less current than the outer conductors.

Some understanding of distributed-capacitor design can be gained by the following analysis. Consider the design shown in FIG. 7. This is a two-capacitor design that has been rendered in circular form to simplify analysis. The designed may be analyzed as follows:

Consider a current $I_o(\phi)$ flowing on the outer conductor and $I_i(\phi)$ flowing on the inner conductor. (All voltages and currents are assumed to have an $e^{j\omega t}$ time dependence.) The voltages along the outer and inner conductors are $V_o(\phi)$ and $V_i(\phi)$, respectively. Conservation of current requires that $I_o(\phi)+I_i(\phi)=I$, independent of angle. There is an inductance per radian for current flow along either conductor of L (approximately the same for $r_o \approx r_i$). There is also a capacitance per radian between the conductors of C. We can then write the following differential equations:

$$dV_o/d\phi = dV_i/d\phi = -j\omega LI \qquad (1)$$

and $$dI_o/d\phi = -dI_i/d\phi = -j\omega C(V_o - V_i) \qquad (2)$$

Figure 8A:
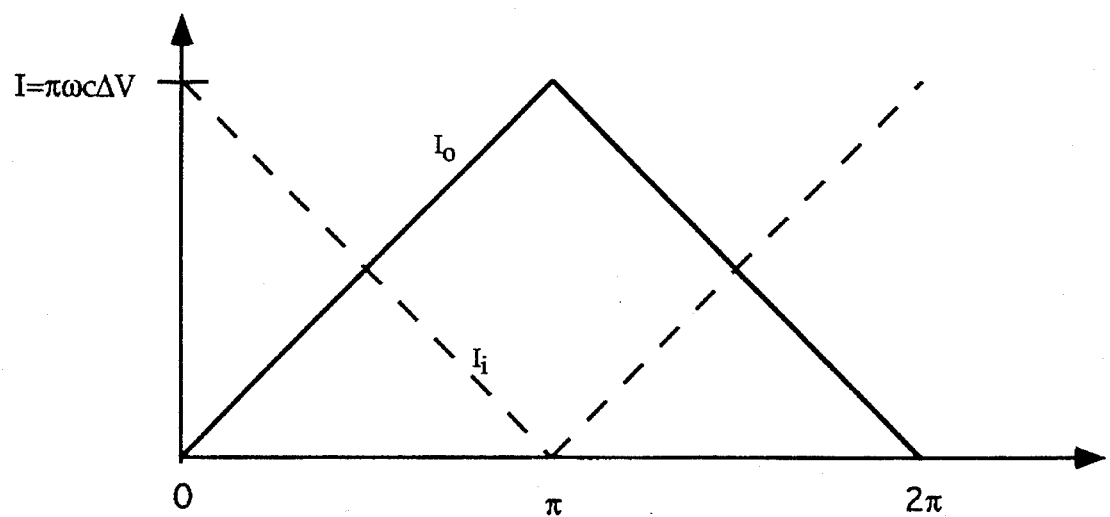
FIG. 8 depicts the current and voltage distribution of the coil of FIG. 7.
Figure 8B:
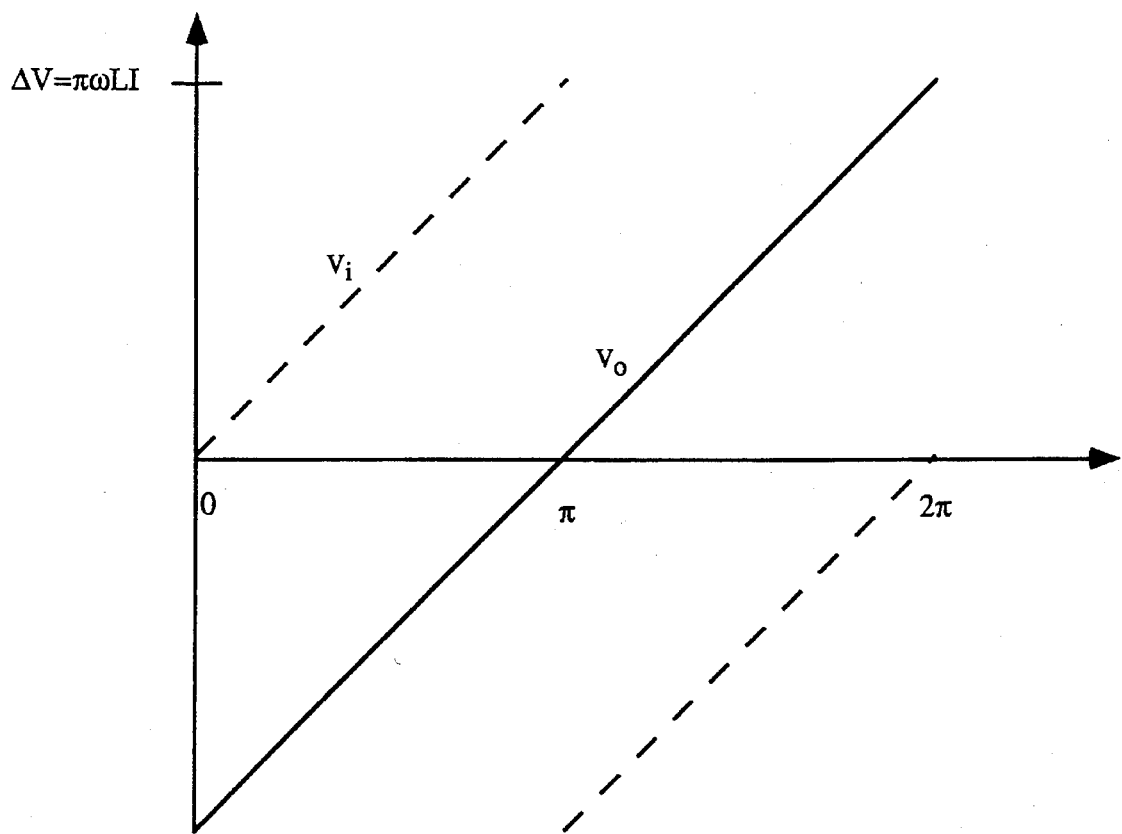

Equation (1) requires that the voltage difference between the inner and outer lines be independent of angle, i.e., $V_o(\phi)-V_i(\phi)=\Delta V$, except at discontinuities. Equation (2) then requires that the inner and outer currents be simple linear functions of angle. With the boundary condition that the current be zero on the outer loop at $\phi=0$ and zero on the inner loop at $\phi=\pi$, we can derive the current and voltage distributions shown in FIG. 8. The linear variation in current along the length of each finger is the motivation for linearly tapering the finger width, as shown in FIG. 6. The constant voltage difference justifies a constant gap dimension (e.g., 50 μm). The width of the gap is selected to withstand half of the peak transmit voltage.

We can also derive the resonant frequency, $f_{res}=(\frac{1}{2\pi})(\pi^2 LC)^{-0.5}$.

In terms of the total inductance and capacitance of the coil, $L_T=2\pi L$ and $C_T=2\pi C$, this is:

$$f_{res}=(\frac{1}{2\pi})(L_T C_T/4)^{-0.5}. \qquad (3)$$

Figure 7:
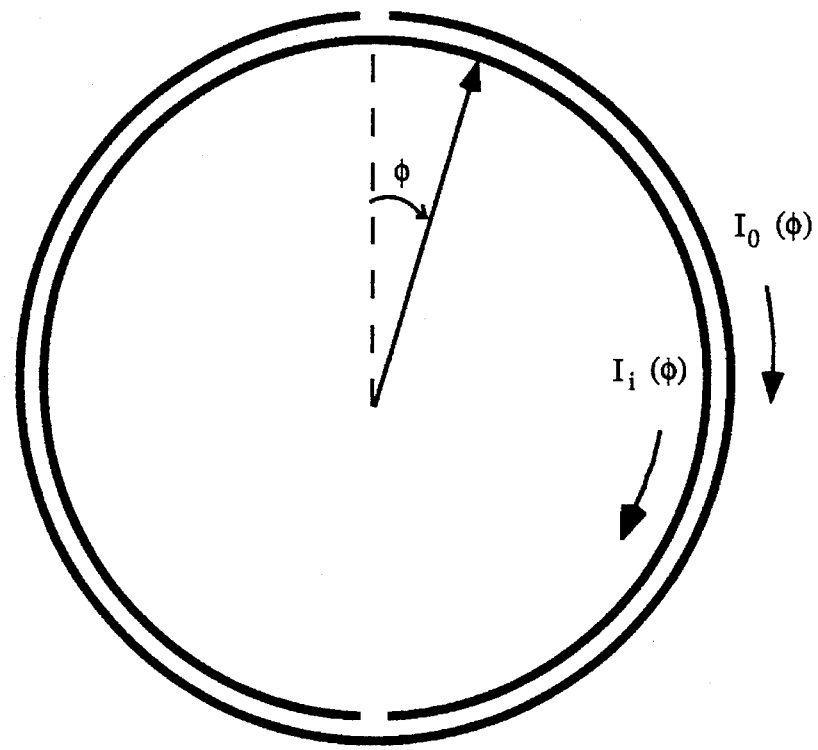
FIG. 7 depicts a simplified two-capacitor coil.

Thus, the coil of FIG. 7 may be treated as a single-turn inductor with a tuning capacitor which is one-fourth of the total distributed capacitance. This coil design may be viewed as a planar, interdigital version of the coil design used for microscopy and described by Black, et al., "A probe for specimen magnetic resonance microscopy," *Investigative Radiology* 27, 157 (1992) and Black et al., "A high-temperature superconducting receiver for nuclear magnetic resonance microscopy," *Science*, vol. 259, p. 793, (1993). In fact, this analysis corroborates the design guideline to treat the two capacitors on the two sides of the structure as having simply their lumped value.

The above analysis was derived in the context of FIG. 7 for interdigital capacitors having only one finger on each electrical side. Clearly, it can be generalized to distributed capacitors of any sort (e.g., interdigital, parallel plate) as long as they can be characterized by some capacitance per unit length. For multifinger designs (FIG. 2a), we have assumed that the capacitance per unit length is proportional to the number of neighboring edges on each side of the capacitor (e.g., the design of FIG. 2a has 6 edges in each capacitor).

Figure 9:
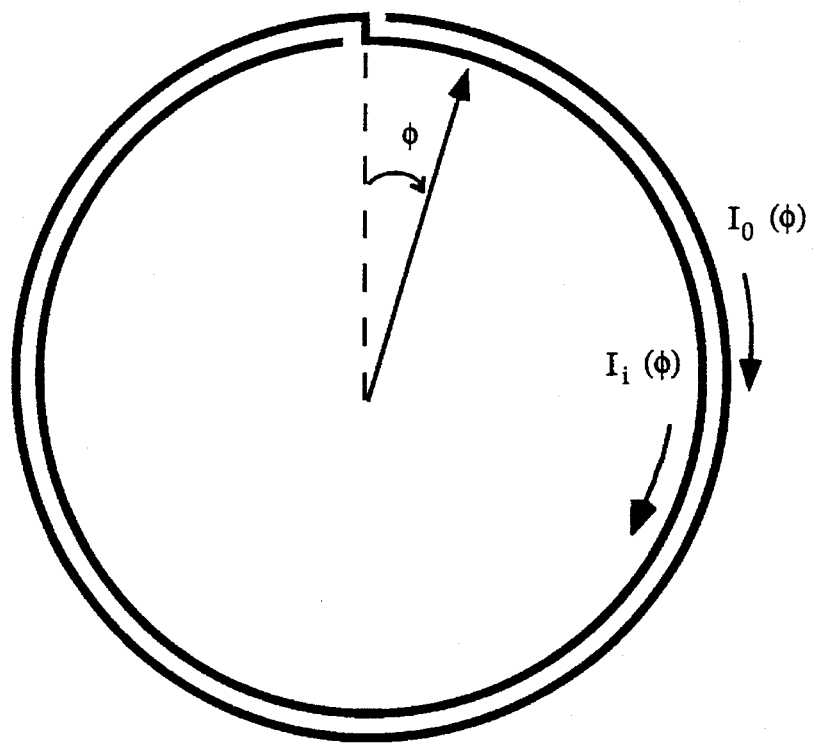
FIG. 9 depicts a simplified one-capacitor coil.
Figure 10:
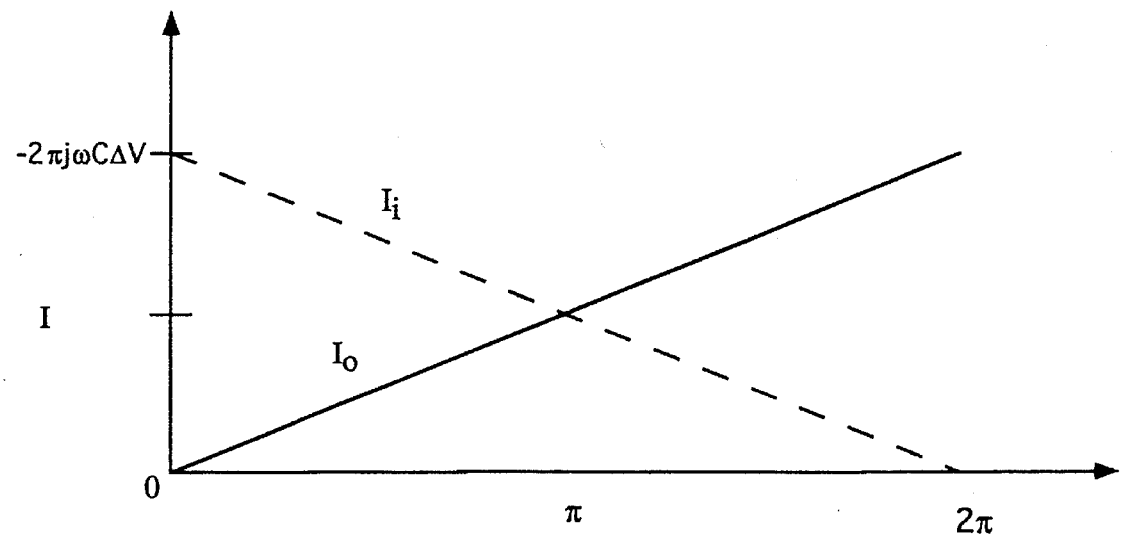
FIG. 10 depicts the current and voltage distribution of the coil of FIG. 9.
Figure 10B:
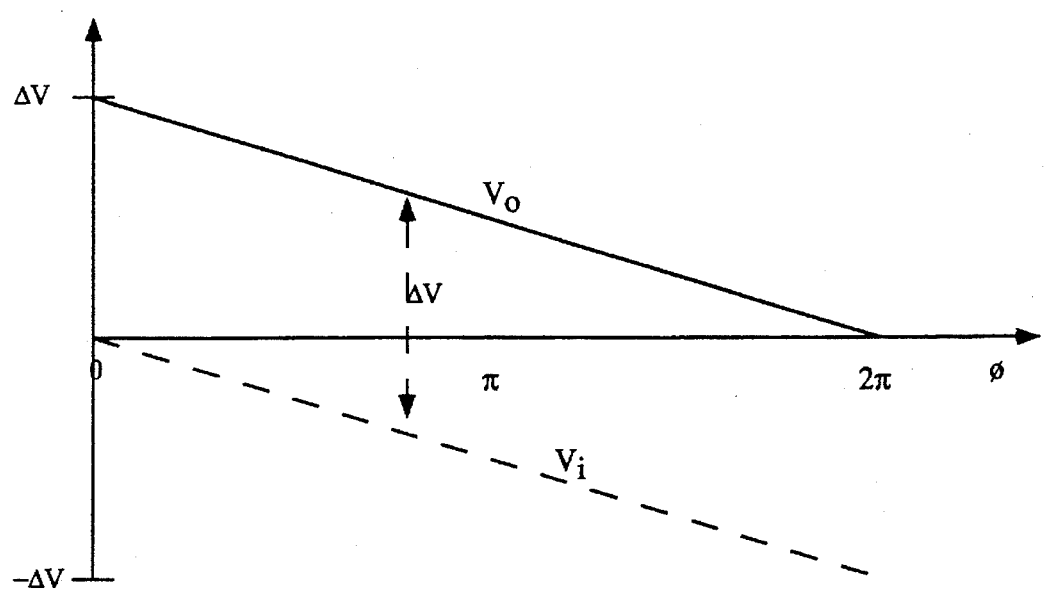

For lower-frequency operation, such as is desired for deuterium locks or for lower-field applications such as live-animal NMR microscopy, it may be difficult to obtain sufficient capacitance using the above design approach. FIG. 9 shows a modification which can effect a substantial reduction in frequency. This design uses, in effect, a single capacitor distributed around a single-turn inductor. The equations 1–3 apply to this design as well as to that of FIG. 6; however, the boundary conditions are very different. The current and voltage distributions in this coil are shown in FIG. 10. Most importantly, the resonant frequency is $f_{res}=(\frac{1}{2\pi})(L_T C_T)^{-0.5}$, where $L_T$ is the inductance of the (effectively) single-turn loop, and $C_T$ is the total distributed capacitance. It can be seen that the distributed nature of the capacitance has no effect on the resonant frequency.

Figure 11:
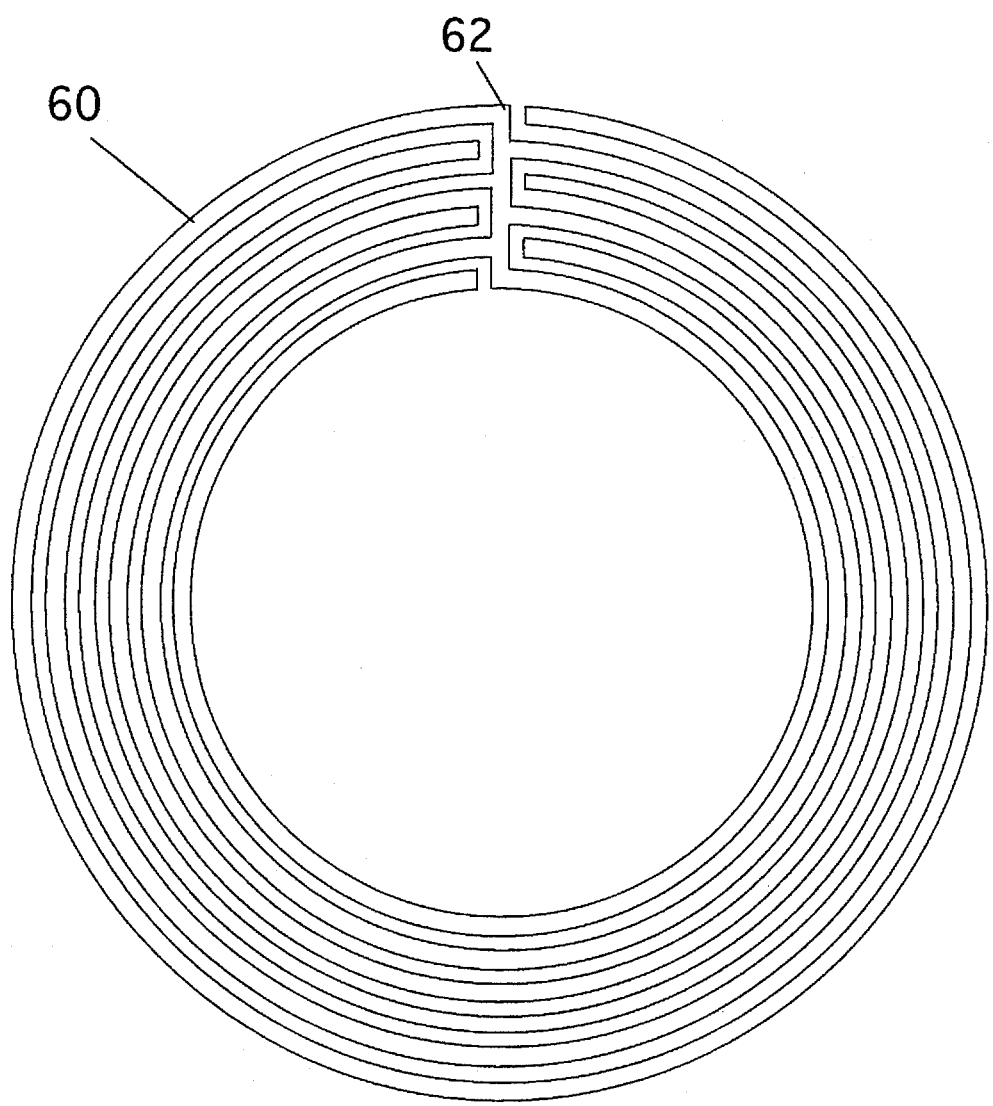
FIG. 11 depicts a single capacitor embodiment of the invention.

As shown in FIG. 11, the single capacitor design can be extended to more than a single pair of fingers. The circular fingers 60 are tied to the common node (top) 62 in an alternating fashion from the left and right. The same analysis applies, but using the increased value of capacitance per radian afforded by the multiplicity of fingers.

In the preferred embodiment, the superconducting films are high-temperature superconductors which possess low radio-frequency surface resistance at temperatures of 77 K or above. These materials include YBaCuO, TlBaCaCuO, BiSrCaCuO, and related perovskite compounds. Deposition may be by sputtering, laser ablation, evaporation, or chemical vapor deposition. The substrate may be sapphire ($Al_2O_3$), $LaAlO_3$, $SrTi O_3$, MgO, yttrium stabilized zirconium (YSZ), or other materials or combinations of these substrates with buffer layers.

The preferred embodiments of the invention, in particular those combining multiple capacitors with fingerlets, require conductive lines as narrow as 10 μm and an untuned resonant frequency of the coil very near the desired resonant frequency. This presents two challenges. First, imperfections in the crystalline structure of the superconductor lines can result in burn out of conductors at the current loading required for operation of the coil. Second, because the resonant frequency of NMR spectroscopy coils must be tuned to a fractional accuracy which is much less than the reciprocal of the loaded quality factor ($Q_L$) of the coil, tuning is a significant challenge for NMR coils made with high-temperature superconducting (HTS) thin films, which have loaded Qs in the range of 10,000. While real-time, reversible tuning using mechanically controlled means can be used to adjust the resonant frequency just before or during NMR measurements, it is desirable to keep the mechanical tuning range to a minimum, as it comes at the expense of a lowered $Q_L$ and increased vibrational sensitivity.

Figure 12:
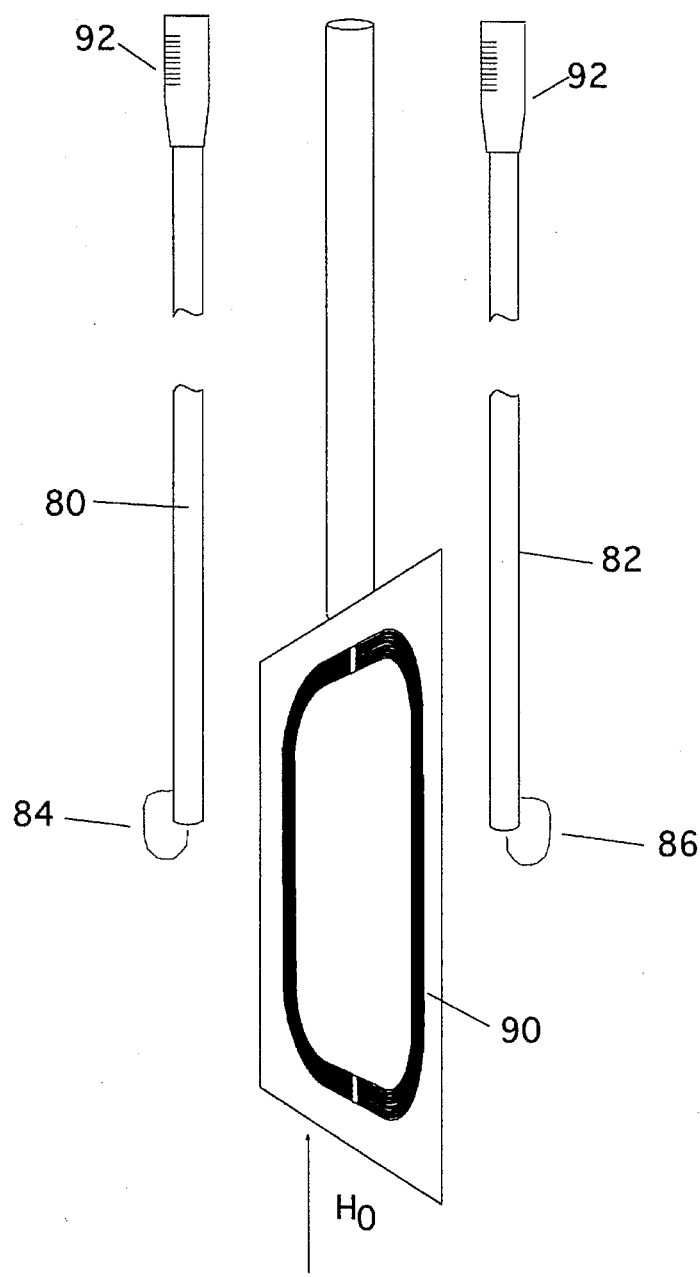
FIG. 12 depicts a fixture for burn in of the coils prior to trimming.
Figure 13:
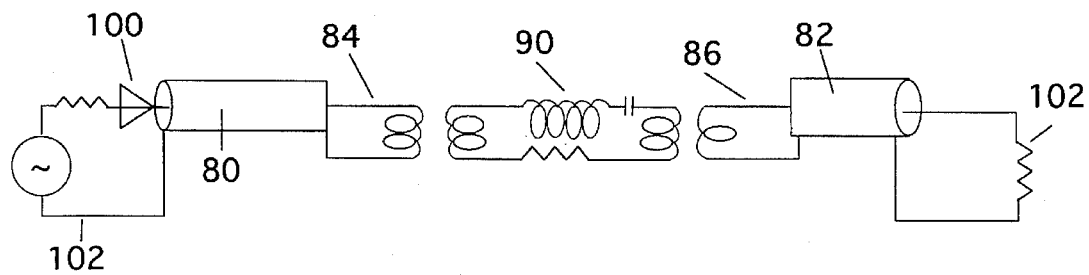
FIG. 13 depicts the equivalent circuit of a burn in fixture with a coil.

To address the problem of burn out of conductors and resultant shifts in the resonant frequency of the coil, we have devised a method to stress, or "burn in," the coils prior to a final trimming process, so that those fingers which are likely to fail will do so prior to final trimming. An essential first step is that the coil design provide more capacitance than is needed, enough so that if all defective fingers are removed, the coil resonant frequency is still below the desired frequency of operation. The coil is typically designed with a resonant frequency 3 to 5 percent below the desired frequency of operation, allowing 6 to 10 percent of the capacitance to be removed. For "burn in," the coil is first mounted in a simple fixture, shown in FIG. 12, that allows it to be cooled in cold helium gas in a dewar. The fixture has two coaxial cables 80, 82 with small loops 84, 86, near the coil 90, terminating the cables. The positions of the two loops relative to the coil can be changed by adjusting micrometers 92 mounted at the top of the fixture at room temperature. FIG. 13 depicts the equivalent circuit of the coil in the burn in apparatus, One cable 80 is connected to a source of RF power. The loop 84 on this "transmit" cable is generally adjusted so that the RF source is strongly coupled to the coil 90. The RF source is usually an amplifier 100 that is driven by a network analyzer 102. The other loop 86 is connected to the network analyzer 102 so that the actual current in the coil can be monitored. This "receive" loop is weakly coupled to the coil, so that it does not significantly perturb the power flow into the coil.

Figure 14:
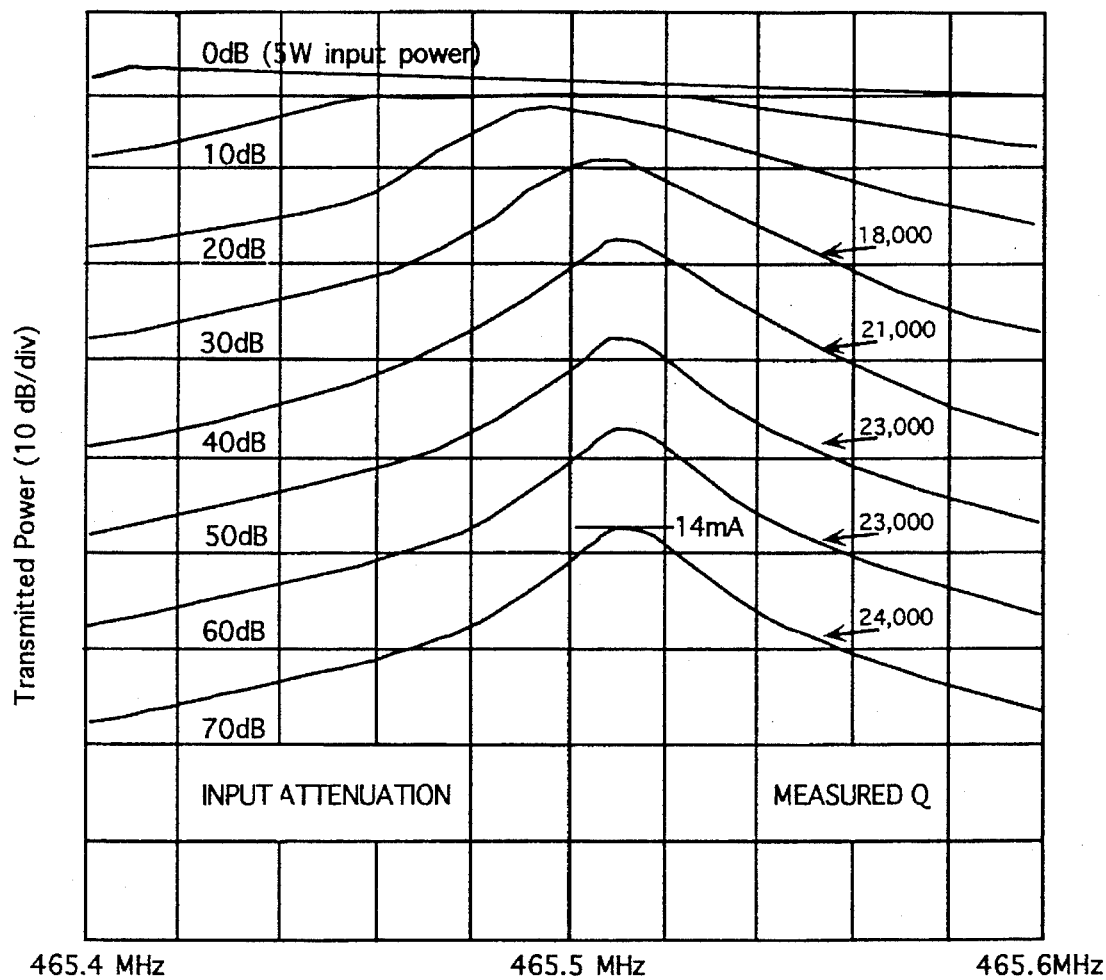
FIG. 14 depicts the power coupled to the receive loop as a function of frequency for a coil in the burn in fixture.

FIG. 14 is a plot of the power received from a coil in the burn in apparatus in a 7 Tesla field. The measurement and burn-in process proceeds as follows:

First, the RF source is set to a low power (typically 0.1 mW), and the transmit and receive loops are adjusted so that the power coupled to the receive loop is no more than 1% of the available power (20 dB or more insertion loss) and the reflected power from the coil at the resonant frequency, $f_{res}$, is minimized, i.e., the coil is matched to the source, and all available power from the RF source is being dissipated in the coil. This may be repeated at an even lower power to ensure operation in a regime where coil resistance is independent of current. As the RF source frequency is swept through resonance, the power coupled to the receive loop traces the lowermost curve in FIG. 14.

Next, the coil matched quality factor, $Q_m$, is calculated from the full width Df of the resonant line at the 3-dB points from $$Q_m = f_{res}/Df$$

and the coil resistance R is calculated from $$R = (2\pi f_{res} L)/(2 Q_m)$$

where L is the coil inductance. The denominator is the unloaded Q, which is twice the matched Q.

The rms current flowing in the coil at resonance under these circumstances is calculated from $$I = (P/R)^{0.5}$$

where P is the available power from the source. As shown in FIG. 14, for the coil of the example, with −33 dBm (0.5 µW) available power, 14 mA is flowing through the coil.

The available power is then increased, and additional plots of power coupled to the receive loop are made. Based on the proportional relationship I=k √P, with k established from the low-power measurement, the current at any point is readily computed. The available power is increased until the observed current at resonance reaches the desired burn-in level, which may be 5 to 50 amperes for typical NMR applications. This may require RF powers of 10 W or more for typical coil matched Qs of 10,000 and inductances of 30 nH. The RF source may be allowed to dwell at the resonant frequency of the coil for some extended period (seconds) in order to effect burn-in. Alternatively, the RF source may be pulsed to simulate the NMR transmit operation. To most completely simulate the operating environment of the coil, the burn-in process may be conducted with the coil inside a magnet, as in FIG. 14.

If, at any time during the burn-in procedure, the resonant frequency of the coil is seen to shift, then the process is repeated from the beginning, with the resonant frequency and the Q at low power being remeasured. This is done until the coil can withstand the desired level of current without undergoing a frequency shift.

After burn-in, coil tuning to the desired frequency is accomplished by techniques such as photolithography, laser trimming, or ultrasonic trimming. The coil shown in FIG. 1a may be used as an example. The desired operational frequency of this particular coil is $f_{op}$=300 MHz. The coil is designed such that its inductance L and capacitance C give a resonant frequency $f_{des}=[2\pi(LC)^{0.5}]^{-1}$ of 295 MHz. The actual resonant frequency $f_1$ is measured using the RF network-analysis techniques discussed above, with weak inductive coupling to the probe. It is important that the probe be at the temperature at which it will be used for NMR measurements and in a similar electrical environment (e.g., electrical shields are present as in the NMR probe to be used in measurement).

From the known dependence of resonant frequency on capacitance, the desired fractional reduction in capacitance can be calculated to be, for small fractional corrections, $$\Delta C/C = 2(1-f_1/f_{op})$$

For the coil of FIG. 1a, capacitance is linear in the amount of edge on either set of electrodes in the interdigital capacitor. Thus, an amount of finger which reduces the edge length by $\Delta L = L \Delta C/C$, where L is the initial edge length, should be removed. This removal is accomplished precisely by covering the coil with photoresist and making one or more exposures of the finger area to be removed with light through a rectangular slit of variable length, width and angular alignment on a microscope. Measurement of the prescribed area to be removed is aided by small tic marks, i.e., a "ruler" provided on the pattern at regular intervals along the length of the finger area. The resist is developed, and the thin film is etched chemically or in an ion mill. It is important that the entire area be removed, not just cut off, as stray capacitance to the cut-off portion is found to be significant. An accuracy of 0.03% in one step has been achieved with this technique. The process, which can be applied to the parallel-plate capacitors in other types of designs, does not degrade the electrical performance of the coil.

A variant of the technique is to trim the coil capacitance in situ, i.e., while the resonant frequency is being measured. This approach requires the use of a laser which is focused on the coil and appropriate optics to view the coil during trimming in the low-temperature measurement environment.

CONCLUSION

It will be appreciated by those skilled in the art that a number of variations are possible within the spirit and scope of the invention. For example, the invention is equally applicable to low temperature superconductors, and to normal metal conductors at room or low temperature. While low temperature superconductor coils do not offer the advantages of operating temperatures above 20 K, they are capable of achieving the extremely high Q. Normal metal coils do not achieve the high Qs of superconductor coils, but may benefit from application of certain aspects of the invention, and are at least minimally functional. It will also be appreciated that the coil design may be optimized for filling factor, depending upon the size and shape of the sample, and may be designed for any desired resonant frequency. Further, it will be appreciated that the invention is useful for NMR spectroscopy and microscopy and for magnetic resonance imaging.

While the foregoing disclosure contains many specificities, it should be understood that these are given by way of example only. The scope of the invention should not be limited by the specific examples given above, but only by the appended claims and their legal equivalents.

What is claimed is:

1. An RF coil for magnetic resonance spectroscopy or microscopy comprising a conductive material comprising a capacitive element and an inductive element, wherein the inductive element comprises an interior loop comprising two interior fingers of width w and two exterior loops, each exterior loop comprising two exterior fingers of width about w/2 and the fingers are proximately disposed whereby a capacitive element is formed between adjacent pairs of fingers.

2. The coil of claim 1 wherein the conductive material is deposited on a substrate.

3. The coil of claim 1 wherein the conductive material is a superconductor.

4. The coil of claim 2 wherein the superconductor is a high temperature superconductor.

5. The capacitor of claim 1 wherein at least one said finger is of reduced length compared to an adjacent finger.

6. The coil of claim 1 wherein the interior fingers are tapered.

7. The coil of claim 2 wherein the interior fingers are tapered.

8. The coil of claim 3 wherein the interior fingers are tapered.

9. A capacitor for use with an inductor in an RF coil comprising a first elongate tapered finger, and a second elongate tapered finger, each finger having a wide end and a narrow end; the wide end of the first finger being proximately disposed to the narrow end of the second finger and the narrow end of the first finger being proximately disposed to the wide end of the second finger, adjacent fingers forming a uniform gap therebetween, whereby a capacitive element is formed between the first and the second finger.

10. The capacitor of claim 9 wherein at least one said finger of one set is of reduced length compared to an adjacent finger.

11. A capacitor for use with an inductive resonator of a magnetic resonance apparatus, comprising:

(a) a first set of elongate conducting fingers numbering at least one finger, each finger of the first set having a first terminal and a second terminal and each finger being essentially monotonically tapered from its first terminal to its second terminal;

(b) a second set of elongate conductive fingers numbering at least one finger, each finger having a first terminal and a second terminal, said second set disposed interdigitated with said first set whereby the first terminals of the first set lie proximal the second terminals of the second set and adjacent fingers define a gap of substantially uniform width therebetween.

12. The capacitor of claim 11 wherein the conductive material is a superconductor.

13. The capacitor of claim 12 wherein the superconductor is a high temperature superconductor.

14. A resonant circuit comprising:

(a) a substrate comprising a dielectric material,
(b) a layer of a conductive material deposited on said substrate, said conductive layer being patterned to form a resonant element comprising an inductive element and a capacitive element wherein, i) said inductive element comprises a plurality of elongate fingers, said fingers forming an essentially closed loop having an innermost turn and an outermost turn and at least one interior turn therebetween, said fingers being proximately disposed to each other and each said two fingers separated by a gap; and ii) said capacitive element is formed between adjacent pairs of fingers; and wherein said innermost, said outermost and said interior turn each has a width and said width of said innermost or outermost turn is about one-half said width of said interior turn.

15. The coil of claim 14 wherein the conductive material is a superconductor.

16. A capacitive element for a magnetic resonance coil comprising:

(a) a first elongate finger of a conductive material, the first finger being slit over most, but less than all, of the length thereof into at least two fingerlets defining between the at least two fingerlets a first gap; and (b) a second elongate finger of a conductive material, the first finger being proximately disposed to the second finger whereby a second gap is of essentially uniform width is defined between the first finger and the second finger, whereby a capacitive element is formed between the first finger and the second finger.

17. The coil of claim 16, wherein the conductive material is a superconductor.

18. A resonant circuit comprising a conductive material comprising the capacitive element of claim 16 and an inductive element, wherein the inductive element comprises the first finger and the first finger is in the form of a loop.

* * * * *